United States Patent
Kurita (10) Patent No.: US 8,492,193 B2
(45) Date of Patent: Jul. 23, 2013

(54) SEMICONDUCTOR SUBSTRATE FOR SOLID-STATE IMAGING SENSING DEVICE AS WELL AS SOLID-STATE IMAGE SENSING DEVICE AND METHOD FOR PRODUCING THE SAME

(75) Inventor: Kazunari Kurita, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 13/252,991

(22) Filed: Oct. 4, 2011

(65) Prior Publication Data

US 2012/0021558 A1 Jan. 26, 2012

Related U.S. Application Data

(62) Division of application No. 11/996,925, filed as application No. PCT/JP2007/067518 on Sep. 7, 2007, now Pat. No. 8,063,466.

(30) Foreign Application Priority Data

Sep. 7, 2006 (JP) ................................. 2006-243267

(51) Int. Cl.
   *H01L 31/18* (2006.01)
(52) U.S. Cl.
   USPC ............. 438/87; 438/471; 438/476; 438/478; 257/E31.003
(58) Field of Classification Search
   USPC ................ 438/73, 75, 87, 143; 257/463, 613, 257/E31.003
   See application file for complete search history.

(56) References Cited

U.S. PATENT DOCUMENTS

| 5,734,195 A | 3/1998 | Takizawa et al. |
| 7,700,394 B2 | 4/2010 | Sadamitsu et al. |
| 2003/0170928 A1 * | 9/2003 | Shimozono et al. ............ 438/73 |
| 2005/0253221 A1 * | 11/2005 | Takase et al. ................. 257/607 |
| 2009/0017291 A1 | 1/2009 | Sadamitsu et al. |

FOREIGN PATENT DOCUMENTS

| CN | 1465105 A | 12/2003 |
| EP | 1 501 122 A1 | 1/2005 |
| EP | 1 677 344 A1 | 7/2006 |
| EP | 1 780 781 A1 | 5/2007 |
| EP | 1 801 863 A1 | 6/2007 |
| JP | 2007/273959 A | 10/2007 |
| TW | 2006/14379 A | 5/2006 |
| WO | 2005/038899 A1 | 4/2005 |
| WO | 2006/003812 A1 | 1/2006 |
| WO | 2006/025409 A1 | 3/2006 |

OTHER PUBLICATIONS

Taiwanese Office Action corresponding to Application No. 96133524, dated May 6, 2011.

(Continued)

*Primary Examiner* — Minh-Loan T Tran
*Assistant Examiner* — Fazli Erdem
(74) *Attorney, Agent, or Firm* — Sughrue Mion, PLLC (57) ABSTRACT

There is provided a semiconductor substrate for solid-state image sensing device in which the production cost is lower than that of a gettering method through a carbon ion implantation and problems such as occurrence of particles at a device production step and the like are solved. Silicon substrate contains solid-soluted carbon having a concentration of $1 \times 10^{16}$–$1 \times 10^{17}$ atoms/cm$^3$ and solid-soluted oxygen having a concentration of $1.4 \times 10^{18}$–$1.6 \times 10^{18}$ atoms/cm$^3$.

1 Claim, 5 Drawing Sheets

OTHER PUBLICATIONS

Japanese Office Action corresponding to Application No. 2007-551507, dated Jun. 15, 2010.

Extended European Search Report dated Mar. 22, 2013, from the European Patent Office in corresponding European Patent Application No. 07806950.7.

* cited by examiner

SEMICONDUCTOR SUBSTRATE FOR SOLID-STATE IMAGING SENSING DEVICE AS WELL AS SOLID-STATE IMAGE SENSING DEVICE AND METHOD FOR PRODUCING THE SAME

This is a Divisional Application of U.S. application Ser. No. 11/996,925 filed Jan. 25, 2008. The entire disclosure of the prior application is hereby incorporated by reference.

TECHNICAL FIELD

This invention relates to a semiconductor substrate for a solid-state image sensing device as well as a solid-state image sensing device and a method for producing the same.

RELATED ART

The solid-state image sensing device is produced by forming circuits on a semiconductor substrate made of a silicon single crystal. In this case, if a heavy metal is incorporated into the semiconductor substrate as an impurity, the electric properties of the solid-state image sensing device are deteriorated remarkably.

As a factor of incorporating the heavy metal as an impurity into the semiconductor substrate are mentioned firstly a metal contamination at the production step of the semiconductor substrate and secondly a heavy metal contamination at the production step of the solid-state image sensing device.

As the former case, there is considered the contamination with heavy metal particles generated from a constituent material of an epitaxial growth furnace when an epitaxial layer is grown on a substrate of a silicon single crystal or with heavy metal particles generated by the corrosion of a metal as a piping material based on the use of chlorine-based gas. Recently, the metal contamination in the epitaxial growth step is attempted to be improved by replacing the constitutional material of the epitaxial growth furnace with a material having a corrosion resistance, but it is difficult to completely avoid the metal contamination at the epitaxial growth step.

Therefore, the metal contamination at the epitaxial growth step has hitherto been avoided by forming a gettering layer in the interior of the semiconductor substrate, or by using a substrate having a high gettering ability for a heavy metal such as a high concentration boron substrate or the like.

On the other hand, in the latter case for the production step of the solid-state image sensing device, there is a fear of contaminating the semiconductor substrate with heavy metal at each of ion implantation step, diffusion step and oxidation heat treatment step among steps of producing the device.

In order to avoid the contamination of heavy metal in the vicinity of an active layer in the device, there is commonly used an intrinsic gettering method wherein oxygen precipitate is formed in the semiconductor substrate, or an extrinsic gettering method wherein a gettering site such as backside damage or the like is formed in a back side of the semiconductor substrate.

In case of the above conventional gettering method, i.e. intrinsic gettering method, however, a multi-stage heat treatment step is required for previously forming the oxygen precipitate in the semiconductor substrate, so that there is feared the increase of the production cost. Furthermore, it is required to conduct the heat treatment at a higher temperature for a long time, so that there is feared the new metal contamination to the semiconductor substrate.

In case of the extrinsic gettering method, since the back side damage or the like is formed in the back side, particles are generated from the back side at the device production step, which causes drawbacks such as formation of defective device and the like.

In the light of the above problems, Patent Document 1 proposes a technique wherein a predetermined dose of ions such as carbon is implanted into one surface of a silicon substrate to form an epitaxial layer of silicon on such a surface for the purpose of reducing white defects generated by a dark current, which exerts on electric characteristics of the solid-state image sensing device. According to this technique, the white defects in the solid-state image sensing device are largely reduced as compared with the epitaxial substrate using the conventional gettering method.

As pointed out in paragraph [0018] of Patent Document 2, in the gettering sink formed by the carbon ion implantation described in Patent Document 1, when the treating temperature at the device production step becomes too high after the formation of the epitaxial layer, the gettering effect by the gettering sink rather lowers. That is, in the gettering sink formed by the carbon ion implantation, there is a limit in the gettering effect. In the technique described in Patent Document 2, therefore, it is devised to set an upper limit to the subsequent treating temperature for sufficiently educing the effect of the buried gettering sink layer through carbon introduction.

Patent Document 1: JP-A-H06-338507
Patent Document 2: JP-A-2002-353434

DISCLOSURE OF THE INVENTION

Problems to be Solved by the Invention

Since the gettering effect is critical in the gettering sink formed by the carbon ion implantation, for example, the upper limit is set in the device treating temperature after the formation of the epitaxial layer, which results in a restriction in the device production step.

Also, the gettering effect of the gettering sink formed by the carbon ion implantation tends to be lowered after the formation of the epitaxial layer, which is difficult to avoid the occurrence of particles in the device production step, so that it is an important matter to make satisfactory the gettering effect at the device production step.

It is, therefore, an object of the invention to provide a semiconductor substrate for solid-state image sensing device being low in the production cost and solving problems such as occurrence of particles and the like at the device production step as compared with the conventional gettering method, particularly the gettering method through carbon ion implantation as well as an advantageous method for producing the same.

Further, it is another object of the invention to provide a high-performance solid-state image sensing device providing excellent electric characteristics by forming a circuit on the above semiconductor substrate as well as an advantageous method for producing the same.

Means for Solving Problems

The inventors have made various studies on a means for avoiding the contamination of heavy metal to the semiconductor substrate without increasing the production cost. As a result of the examination on the gettering method through the carbon ion implantation, it is revealed that the gettering action through the carbon ion implantation is mainly dependent on an oxide precipitated from disorder (strain) of silicon lattice by the ion implantation through high energy and such a lattice disorder concentrates in a narrow ion-implanted zone and also strain around the oxide is easily released in a high temperature heat treatment of, for example, the device production step, and hence the gettering effect is particularly poor in the heat treatment step of the device.

Now, the action of carbon engaging in the formation of the gettering sink in the silicon substrate is examined in detail, and as a result, it has been discovered that carbon is solid-soluted in the silicon lattice in a silicon-substituting form instead that carbon is forcedly introduced by the ion implantation and carbon-oxygen based precipitates involving dislocation (carbon-oxide composite) are elicited from the substituted carbon at a high density in, for example, the device production step and such carbon-oxygen based precipitates provide a high gettering effect. Furthermore, it has been found that such a substituted carbon is first introduced by including into a silicon single crystal at a solid-solution state, and as a result, the invention has been accomplished.

That is, the summary of the invention is as follows.

(1) A semiconductor substrate for solid-state image sensing device, characterized in that a silicon substrate contains solid-soluted carbon having a concentration of $1\times10^{16}$-$1\times10^{17}$ atoms/cm$^3$ and solid-soluted oxygen having a concentration of $1.4\times10^{18}$-$1.6\times10^{18}$ atoms/cm$^3$.

(2) A semiconductor substrate for solid-state image sensing device according to the item (1), wherein an epitaxial layer of silicon is existent on the silicon substrate.

(3) A semiconductor substrate for solid-state image sensing device according to the item (2), wherein silicon oxide layer is existent on the epitaxial layer.

(4) A semiconductor substrate for solid-state image sensing device according to the item (3), wherein a silicon nitride layer is existent on the oxide film.

(5) A method for producing a semiconductor substrate for solid-state image sensing device, characterized in that silicon crystal is previously included with carbon at a solid-soluted concentration of $1\times10^{16}$-$1\times10^{17}$ atoms/cm$^3$ and oxygen at a solid-soluted concentration of $1.4\times10^{18}$-$1.6\times10^{18}$ atoms/cm$^3$ in the production of a single crystal silicon substrate.

(6) A method of producing a semiconductor substrate for solid-state image sensing device according to the item (5), wherein the single crystal silicon substrate is produced by using CZ (Czochralski) method or MCZ (magnetic field applied Czochralski crystal growth) method.

(7) A solid-state image sensing device comprising a silicon substrate and a buried-type photodiode formed thereon, characterized in that carbon-oxide based precipitates having a size of not less than 10 nm are existent in the silicon substrate at a density of $1\times10^6$-$1\times10^8$ precipitates/cm$^2$.

Moreover, the term "size" used herein means a diagonal length of the precipitate in TEM image observed at a section of the silicon substrate in a thickness direction thereof, and is expressed by an average value of the precipitates in the observed field.

(8) A method for producing a solid-state image sensing device, characterized in that a layer required for the formation of a device is formed on a silicon substrate containing solid-soluted carbon of $1\times10^{16}$-$1\times10^{17}$ atoms/cm$^3$ and solid-soluted oxygen of $1.4\times10^{18}$-$1.6\times10^{18}$ atoms/cm$^3$ in a silicon single crystal and then subjected to a heat treatment to promote oxygen precipitation reaction to thereby form a gettering sink through carbon-oxygen based precipitates in the silicon substrate.

(9) A method for producing a solid-state image sensing device according to the item (8), wherein the heat treatment is a heat treatment in the production process of the device.

(19) A method for producing a solid-state image sensing device according to the item (8) or (9), wherein carbon-oxygen based precipitates having a size of not less than 10 nm are precipitated at a density of $1\times10^6$-$1\times10^8$ precipitates/cm$^2$ at the step of the heat treatment.

Effect of the Invention

In the semiconductor substrate for solid-state image sensing device according to the invention, carbon-oxygen based precipitates having a high gettering ability can be formed by including solid-soluted carbon into CZ crystal or MCZ crystal and utilizing the heat treatment step in the production step of mounting a device on the semiconductor substrate.

Therefore, the gettering sink can be formed just beneath the buried photodiode over a full thickness of the silicon substrate, so that the diffusion of heavy metal at the device production step is particularly suppressed to avoid the occurrence of defects in the device, and hence it is possible to provide a high quality solid-state image sensing device having good electric characteristics at a low cost.

| DESCRIPTION OF REFERENCE SYMBOLS | |
|---|---|
| 1 | silicon substrate |
| 2 | epitaxial layer |
| 3 | semiconductor substrate |
| 4 | silicon oxide layer |
| 5 | silicon nitride layer |
| 6 | solid-state image sensing device |

BEST MODE FOR CARRYING OUT THE INVENTION

Next, the semiconductor substrate according to the invention will be described in detail with reference to the drawings.

Figure 1:
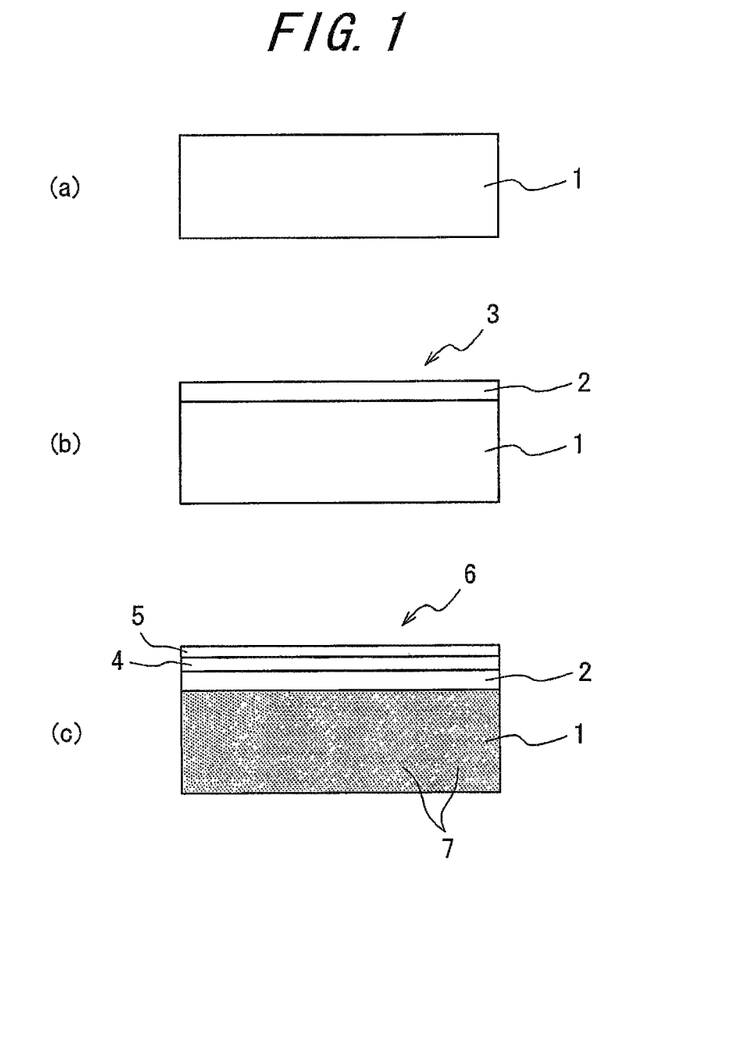
FIG. 1 is schematic view illustrating a production procedure of a semiconductor substrate for solid-state image sensing device and further a solid-state image sensing device according to the invention.

FIG. 1 is a schematic view illustrating a production method of a semiconductor substrate for solid-state image sensing device according to the invention. In the illustrated embodiment, heaped polysilicon as a starting material for silicon crystal is first placed in, for example, a quartz crucible and further a proper amount of graphite powder is applied onto the surface of the polysilicon, and then a CZ crystal added with carbon is prepared, for example, according to a Czochralski method (CZ method).

Moreover, the CZ crystal is an address term of crystals inclusive of a magnetic field applied CZ crystal prepared according to the Czochralski method.

At this moment, carbon is added at a stage of the starting material and a silicon single crystal is prepared from the carbon added starting material, whereby there is obtained a silicon substrate 1 containing carbon at a solid-soluted state (see FIG. 1(a)). The thus obtained silicon substrate 1 is important to contain solid-soluted carbon having a concentration of $1 \times 10^{16}$-$1 \times 10^{17}$ atoms/cm$^3$ and solid-soluted oxygen having a concentration of $1.4 \times 10^{18}$-$1.6 \times 10^{18}$ atoms/cm$^3$.

At first, the reason why carbon is included at a solid-soluted state is due to the fact that carbon is introduced into silicon lattices in form of substituting with silicon. That is, since the atomic radius of carbon is shorter than that of silicon atom, when carbon is coordinated in a substitution position, a stress field of a crystal is a compression stress field and interstitial oxygen and impurities are apt to be easily caught. Therefore, precipitates with oxygen involving dislocation are easily created from the substitution-positioned carbon, for example, at the device production step in a high density, whereby a high gettering effect can be given to the silicon substrate 1.

It is required that the concentration of solid-soluted carbon added is controlled to a range of $1 \times 10^{16}$-$1 \times 10^{17}$ atoms/cm$^3$. When the concentration of solid-soluted carbon is less than $1 \times 10^{16}$ atoms/cm$^3$, the promotion of forming the carbon-oxygen based precipitates is not active, so that the formation of the carbon-oxygen based precipitates at a high density can not be attained.

Figure 3:
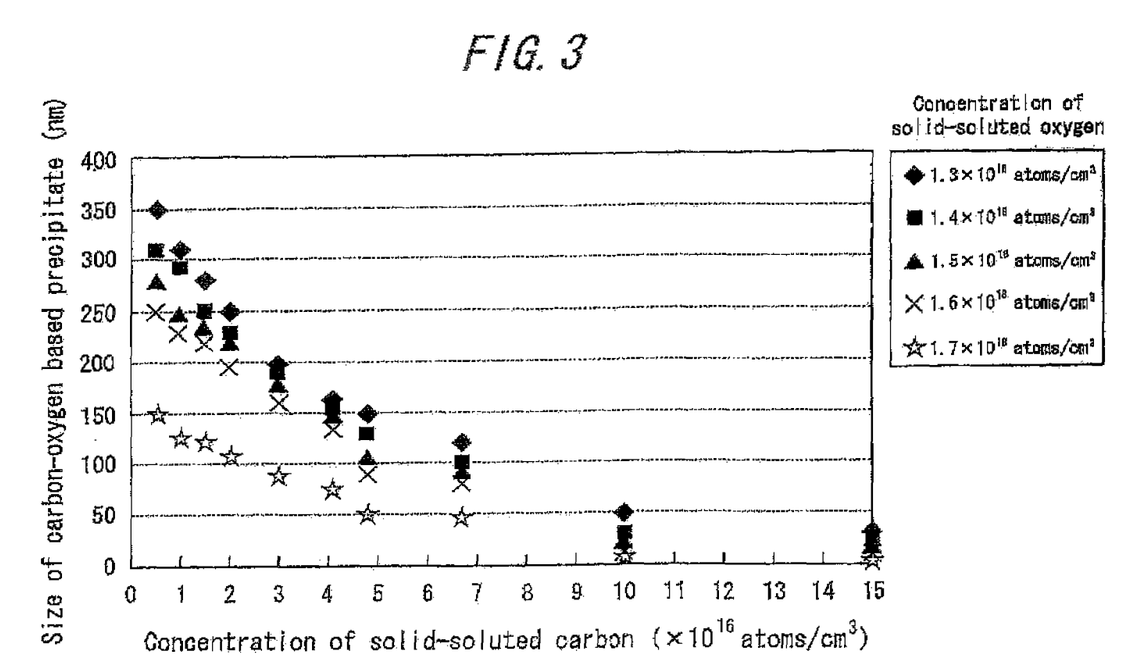
FIG. 3 is a graph showing a relation between a concentration of solid-soluted carbon and a size of a carbon-oxygen based precipitate in a silicon substrate.

The results measured on the number of carbon-oxygen based precipitates by varying the concentration of solid-soluted carbon in the silicon substrate are shown in FIG. 3. Moreover, the measurement of the concentration of solid-soluted carbon is carried out by a Fourier transformation infrared absorption spectrophotometry (FT-IR). Also, the measurement of the carbon-oxygen based precipitate number is carried out by observing TEM image at a section of the silicon substrate in a thickness direction thereof. As shown in FIG. 3, when the concentration of solid-soluted carbon is less than $1 \times 10^{16}$ atoms/cm$^3$, the formation of the carbon-oxygen based precipitates decreases extremely.

On the other hand, when it exceeds $1 \times 10^{17}$ atoms/cm$^3$, the formation of the carbon-oxygen based precipitates is promoted to obtain high density carbon-oxygen based precipitates, but the size of the precipitate is suppressed and hence strain around the precipitate strongly tends to be weakened. Therefore, the effect of the strain becomes weak and the effect for catching the impurity reduces.

Figure 4:
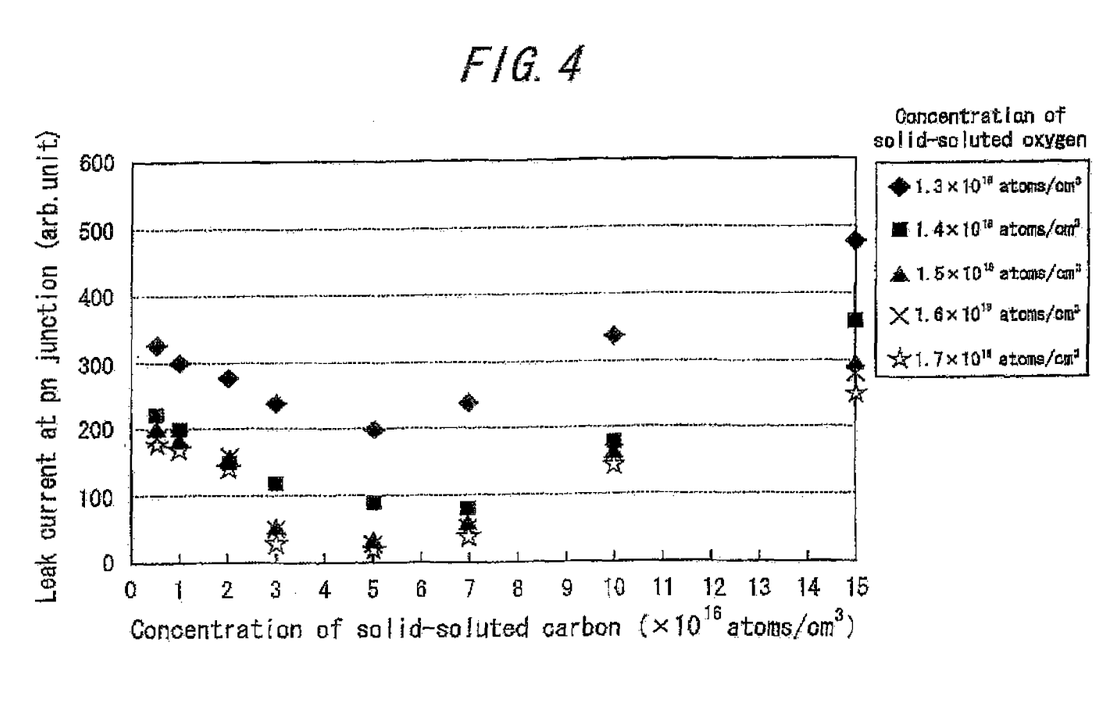
FIG. 4 is a graph showing a relation between a solid-soluted carbon concentration in a silicon substrate and a leak current at pn junction of photodiode.

The results measured on the size of the carbon-oxygen based precipitate by varying the concentration of solid-soluted carbon in the silicon substrate are shown in FIG. 4. Moreover, the size of the carbon-oxygen based precipitate is measured by observing TEM image at a section of the silicon substrate in a thickness direction thereof to determine a diagonal line of the precipitate and expressed by an average of the measured values.

As shown in FIG. 4, when the concentration of solid-soluted carbon exceeds $1 \times 10^{17}$ atoms/cm$^3$, the size of the carbon-oxygen based precipitate becomes extremely small.

Further, when it is required that the concentration of solid-soluted oxygen in the silicon substrate 1 is controlled to a range of $1.4 \times 10^{18}$-$1.6 \times 10^{18}$ atoms/cm$^3$. When the concentration of solid-soluted oxygen is less than $1.4 \times 10^{18}$ atoms/cm$^3$, the formation of the carbon-oxygen based precipitates is not promoted, and hence the above high density carbon-oxygen based precipitates are not obtained.

On the other hand, when it exceeds $1.6 \times 10^{18}$ atoms/cm$^3$, the size of oxygen precipitate is reduced and the effect of strain at an interface of the precipitate to silicon atom of the matrix is mitigated, and hence there is a fear of lowering the gettering effect through the strain.

Since the density of the carbon-oxygen based precipitates becomes involved in the occurrence of white defects in the solid-state image sensing device, a relation between the concentration of solid-soluted carbon and the concentration of solid-soluted oxygen in the silicon substrate 1 is examined with respect to a leak current of a photodiode junction proportional to the number of white defects. The results are shown in FIG. 2.

Moreover, the leak current of the photodiode junction is made as follows. At first, the silicon substrate is cleaned with a SC-1 cleaning solution (NH$_4$OH:H$_2$O$_2$:H$_2$O=1:1:5) and then cleaned with a SC-2 cleaning solution (HCl:H$_2$O$_2$:H$_2$O=1:1:5). Next, the wafer is wet-oxidized at 1100° C. for 110 minutes to form a field silicon oxide layer of 600 nm in thickness on the surface of the wafer. Thereafter, the silicon oxide layer is patterned by a photolithography to form a diffusion window, and n+ layer is formed thereon by a solid layer diffusion using phosphorus oxychloride (POCl$_3$). In this case, the condition of phosphorus diffusion is that PSG (phosphorus silicate glass) film is removed by etching at 900° C. for 20 minutes and thermal diffusion is conducted at 1000° C. for 60 minutes. The n+ layer has a diffusion depth of about 2 μm and a concentration of $1 \times 10^{19}$/cm$^3$. After the formation of a contact hole, Al containing 1.5 mass % of Si is deposited thereon at a thickness of 500 nm by sputtering. After the patterning of an electrode, an annealing treatment is carried out at 450° C. in N$_2$ atmosphere, and finally an oxide film is removed from a back surface. A pattern having a joint area of 1.8 mm is used.

A leak current at the thus obtained pn junction of the silicon substrate is measured by means of HP4140 (pA) meter by applying a voltage to such a junction. In this case, it is designed to suppress a p-type surface inversion by applying a bias to a guard ring by HP4141B (current voltage source). As a negative guard ring bias is used −20 V. The measurement is conducted at 20 places of the silicon substrate (wafer), and an average thereof is a leak current.

Figure 2:
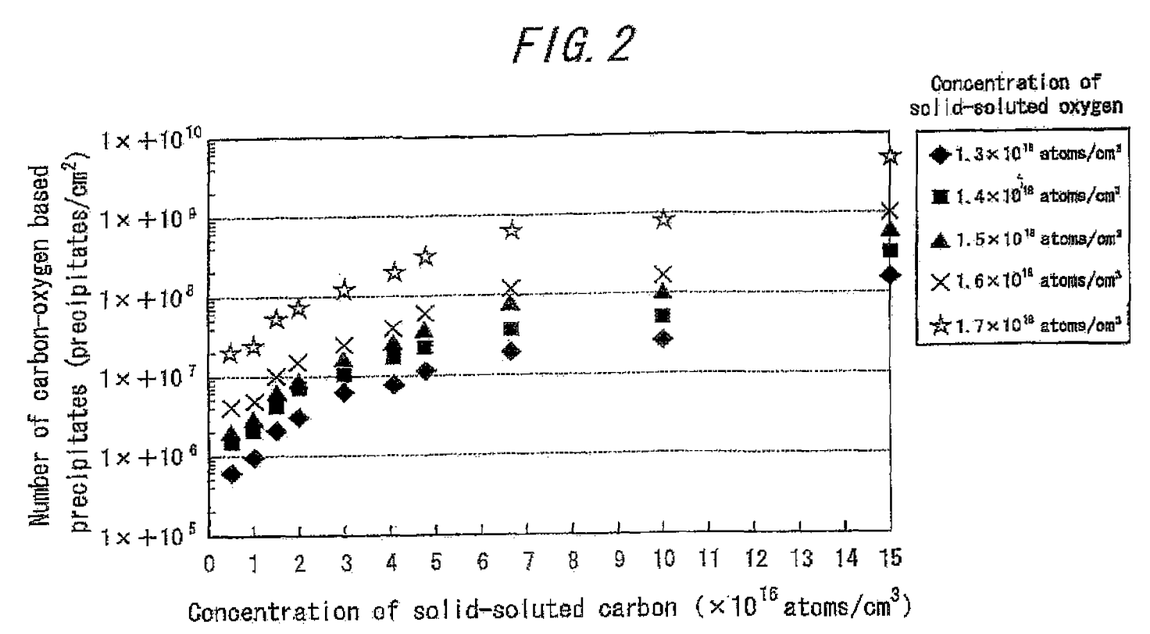
FIG. 2 is a graph showing a relation between a concentration of solid-soluted carbon and a number of carbon-oxygen based precipitates in a silicon substrate.

As shown in FIG. 2, when the concentration of solid-soluted carbon is within a range of $1 \times 10^{16}$-$1 \times 10^{17}$ atoms/cm$^3$, the leak current at pn junction decreases. Further, noting the concentration of solid-soluted oxygen, when the concentration of solid-soluted oxygen is less than $1.4 \times 10^{18}$ atoms/cm$^3$ and becomes $1.3 \times 10^{18}$ atoms/cm$^3$, it is confirmed that the leak current at pn junction largely decreases even at any concentrations of solid-soluted carbon. This tendency on the concentration of solid-soluted oxygen is recognized even in FIGS. 3 and 4 in a similar fashion.

On the other hand, when the concentration of solid-soluted oxygen exceeds $1.6 \times 10^{18}$ atoms/cm$^3$, or when it becomes $1.7 \times 10^{18}$ atoms/cm$^3$ exceeding $1.6 \times 10^{18}$ atoms/cm$^3$ as shown in FIG. 3, the size of the carbon-oxygen based precipitate decreases. This decrease of the size leads to the mitigation of the strain effect at the interface between silicon atom of the matrix and the precipitate, so that it is feared to lower the gettering effect through the strain.

Next, the silicon substrate 1 being the carbon added CZ crystal is subjected to RCA cleaning with, for example, a combination of SC1 and SC2 in order to grow an epitaxial layer after the surface mirroring of the substrate. Thereafter, the substrate is placed in an epitaxial growth furnace to grow an epitaxial layer 2 having a predetermined thickness (see FIG. 1(b)).

Moreover, various CVD methods (chemical vapor deposition method) can be used in the growth of the epitaxial layer 2.

At this moment, the thickness of the epitaxial layer 2 is preferable to be a range of 2-9 μm in view that the spectral response characteristics of the solid-state image sensing device are improved.

A semiconductor substrate 3 provided with the above epitaxial layer 2 is supplied to the following device production step after an silicon oxide layer 4 and further a silicon nitride layer 5 are formed on the epitaxial layer 2, if necessary. At this step, a buried type photodiode is formed in the epitaxial layer 2 to obtain a solid-state image sensing device 6.

Moreover, the thicknesses of the silicon oxide layer 4 and the silicon nitride layer 5 are preferable to be 50-100 nm in the silicon oxide layer 4 and 1.0-2.0 μm in the silicon nitride layer 5, concretely polysilicon gate film 5 in the solid-state image sensing device from the restrictions in the designing of an operating voltage of a charge transfer transistor.

The silicon substrate 1 in the semiconductor substrate 3 supplied to the device production step is the CZ crystal containing solid-soluted carbon, but oxygen precipitating nucleus or oxygen precipitate formed in the crystal growth is shrunk by the heat treatment in the epitaxial growth, so that the actualized oxygen precipitates are not existent in the silicon substrate 1 at the stage of the semiconductor substrate 3.

Therefore, in order to ensure a gettering sink for gettering heavy metal, it is required that the substrate is subjected to a low temperature heat treatment of, preferably, about 600° C.-700° C. after the growth of the epitaxial layer to separate out carbon-oxygen based precipitates 7 from the substitution-positioned carbon (see FIG. 1(c)).

In the device production step or the general step of producing the solid-state image sensing device, the initial stage thereof is common to include a heat treatment step of about 600° C.-700° C., so that it is possible to grow and form the carbon-oxygen based precipitates by using the semiconductor substrate 3 containing the solid-soluted carbon as a substrate for solid-state image sensing device through the device production step.

In the invention, the "carbon-oxygen based precipitate" means a precipitate of carbon-oxygen composite (cluster) containing carbon.

The carbon-oxygen based precipitates are spontaneously separated out over the whole of the silicon substrate 1 through the initial stage of the device production step by using the semiconductor substrate 3 containing the solid-soluted carbon, so that the gettering sink having a high gettering ability against metal contamination at the device production step can be formed over a full thickness of the silicon substrate 1 just beneath the epitaxial layer. Therefore, the gettering in a region close to the epitaxial layer can be realized.

In order to realize this gettering, the carbon-oxygen based precipitates are important to have a size of not less than 10 nm and to be existent in the silicon substrate at a density of $1 \times 10^6 - 1 \times 10^8$ precipitates/cm$^2$.

When the size of the carbon-oxygen based precipitates is not less than 10 nm, the probability of catching (gettering) impurities between the lattices (e.g. heavy metal and so on) is increased by utilizing the strain effect generated at the interface between silicon atom of the matrix and the oxygen precipitate.

Also, the density of the carbon-oxygen based precipitates having a size of not less than 10 nm is within a range of $1 \times 10^6 - 1 \times 10^8$ precipitates/cm$^2$ because the catching (gettering) of heavy metal in the silicon crystal is dependent on the strain generated at the interface between silicon atom of the matrix and the oxygen precipitate and an interface state density (volume density).

Moreover, as the above device production step can be adopted the general production step for the solid-state image sensor. An example of such a step is shown in FIG. 5 for CCD device, but it is not particularly limited to FIG. 5.

Figure 5:
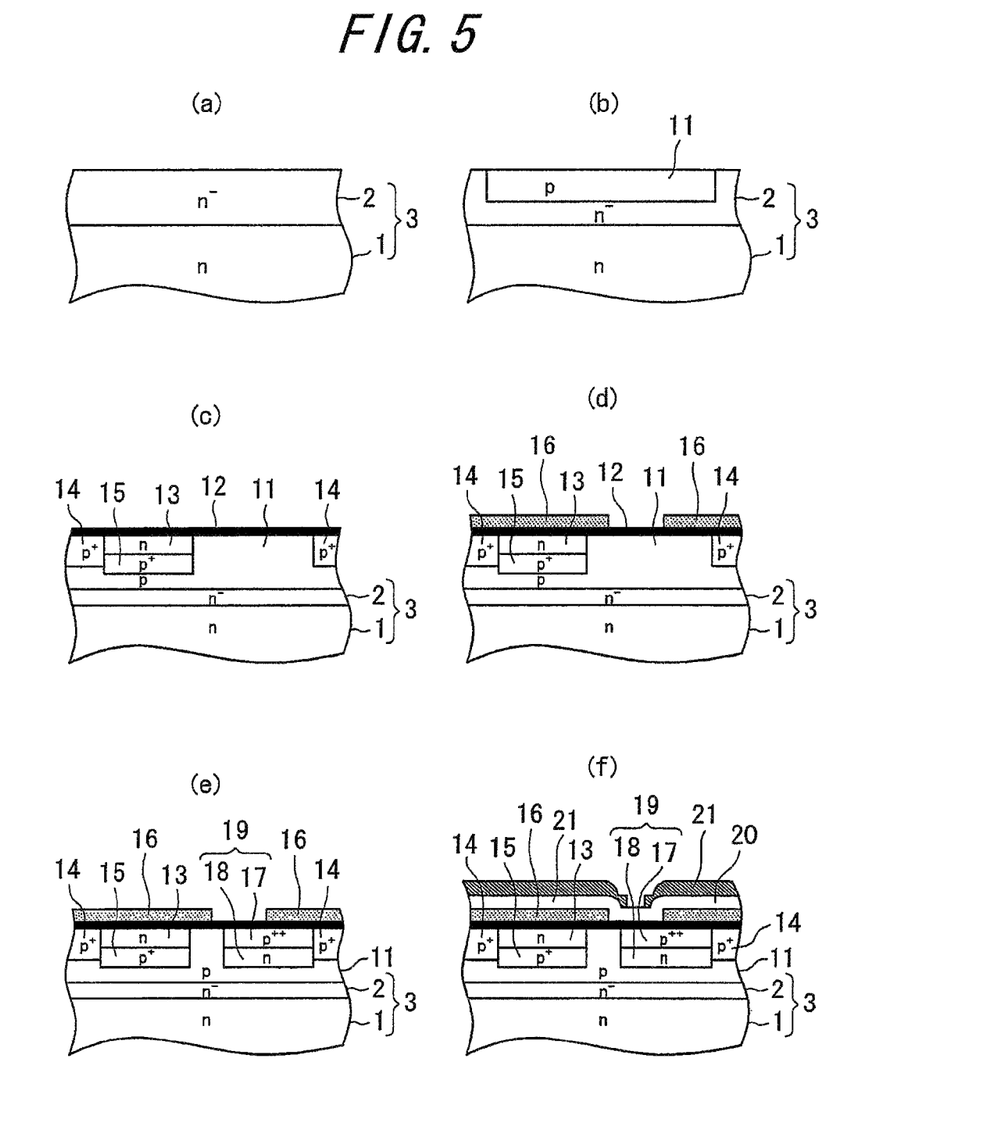
FIG. 5 is a schematic view illustrating a production procedure of a solid-state image sensing device.

In the device production step, there is first provided a semiconductor substrate 3 wherein an n-type epitaxial layer 2 is formed on a silicon substrate 1 shown in FIG. 5(a) and then a first p-type well region 11 is formed at a predetermined position of the epitaxial layer 2 as shown in FIG. 5(b). Thereafter, as shown in FIG. 5(c), a gate insulating film 12 is formed on the surface, while n-type and p-type impurities are selectively implanted into the interior of the first p-type well region 11 by ion implantation to form n-type transfer channel region 13, p-type channel stop region 14 and second p-type well region 15 constituting a vertical transfer resistor, respectively.

Then, as shown in FIG. 5(d), a transfer electrode 16 is formed on the surface of the gate insulating film 12 at a predetermined position. Thereafter, as shown in FIG. 5(e), n-type and p-type impurities are selectively implanted between the n-type transfer channel region 13 and the second p-type well region 15 to form a photodiode 19 comprised of a laminate of p-type positive charge storing region 17 and n-type impurity diffusing region 18.

Further, as shown in FIG. 5(f), an interlayer insulating film 20 is formed on the surface, and then a light shielding film 21 is formed on the surface of the interlayer insulating film 20 other than a portion just above the photodiode 19, whereby a solid-state image sensing device 10 can be produced.

At the above device production step, it is usual to conduct a heat treatment of about 600-1000° C. in, for example, the formation of gate oxide film, separation of element and formation of polysilicon gate electrode. In this heat treatment can be attempted the above precipitation of the carbon-oxygen based precipitates 7, which can act as a gettering sink in the subsequent steps.

EXAMPLES

A heaped polysilicon as a starting material for silicon crystal is placed in a quartz crucible and a proper amount of graphite powder is applied onto the surface of the polysilicon, and then a CZ crystal added with carbon is prepared according to a Czochralski method (CZ method). Concentrations of solid-soluted carbon and solid-soluted oxygen in a silicon substrate cut out as a wafer from the CZ crystal are shown in Table 1. Then, the thus obtained silicon substrate is subjected to a surface contamination (contaminant: Fe, Cu, Ni and contamination concentration: $1 \times 10^{13}$ atoms/cm$^2$) by a spin coating method, and further subjected to a heat treatment under temperature conditions corresponding to a heat treatment in the production of a solid-state image sensing device.

With respect to a gettering ability of the silicon substrate, a contamination concentration of metals on the surface of the silicon substrate is measured by an atomic spectrophotometry and a gettering efficiency is determined according to the following equation.

ACCOUNT

Gettering efficiency=(surface contamination concentration after heat treatment)/(initial surface contamination concentration)×100(%)

The results are also shown in Table 1 as gettering efficiency of not less than 90%: ⊚, less than 90% but not less than 80%: ○, less than 80% but not less than 50%: Δ and less than 50%: X, from which it is understood that the semiconductor substrate according to the invention has a sufficient durability to the contamination of heavy metal at the production step of the solid-state image sensing device.

TABLE 1

| | | \multicolumn{5}{c}{Concentration of solid-soluted oxygen ($\times 10^{18}$ atoms/cm$^3$)} | | | | |
|---|---|---|---|---|---|---|
| | | 1.3 | 1.4 | 1.5 | 1.6 | 1.7 |
| Concentration of solid-soluted carbon (atoms/cm$^3$) | $0.5 \times 10^{16}$ | X | X | X | X | X |
| | $1.0 \times 10^{16}$ | X | Δ | Δ | Δ | Δ |
| | $2.0 \times 10^{16}$ | X | Δ | Δ | Δ | Δ |
| | $3.0 \times 10^{16}$ | ○ | ○ | ○ | ○ | ○ |
| | $5.0 \times 10^{16}$ | ◎ | ◎ | ◎ | ◎ | ◎ |
| | $7.0 \times 10^{16}$ | ◎ | ◎ | ◎ | ◎ | ◎ |
| | $10.0 \times 10^{16}$ | X | Δ | Δ | Δ | Δ |
| | $15.0 \times 10^{16}$ | X | X | X | X | X |

Then, as shown in FIG. 1(b), the surface of the silicon substrate 1 is subjected to a mirror polishing, RCA-cleaned with a combination of SC-1 and SC-2, and placed in an epitaxial growth furnace to form an epitaxial layer 2 having a thickness of 4.5 μm by CVD method. Moreover, the CVD method is conducted by using SiHCl$_3$ (trichlorosilane) and SiH$_4$ (monosilane) as a starting gas.

A solid-state image sensing device is produced by preparing CMOS device on the thus formed semiconductor substrate 3 provided with the epitaxial layer 2 according to the procedures shown in FIG. 5. In the step of forming a gate oxide film at the device production step (FIG. 5(c)), the number and size of carbon-oxygen based precipitates in the silicon substrate 1 through the heat treatment of 700° C. are investigated. The results are shown in Tables 2-6.

With respect to the thus obtained solid-state image sensing device, a dark, backward leak current of PN junction diode is investigated. The results are also shown in Tables 2-6 as leak current of less than 80 arb. Unit: ◎, not less than 80 arb. Unit but less than 130 arb. Unit: ○, not less than 130 arb. Unit but less than 160 arb. Unit: Δ and not less than 160 arb. Unit: X, from which it is understood that the leak current is suppressed in the solid-state image sensor using the semiconductor substrate according to the invention.

TABLE 2

Concentration of solid-soluted oxygen: $1.3 \times 10^{18}$ (atoms/cm$^3$)

| No | Concentration of solid-soluted carbon (atoms/cm$^3$) | Number of carbon-oxygen based precipitates (precipitates/cm$^2$) | Size of carbon-oxygen based precipitate (nm) | Leak current |
|---|---|---|---|---|
| 1-1 | $0.5 \times 10^{16}$ | $6.0 \times 10^5$ | 350 | X |
| 1-2 | $1.0 \times 10^{16}$ | $9.0 \times 10^5$ | 310 | X |
| 1-3 | $2.0 \times 10^{16}$ | $3.0 \times 10^6$ | 250 | X |
| 1-4 | $3.0 \times 10^{16}$ | $6.0 \times 10^6$ | 200 | ○ |
| 1-5 | $4.0 \times 10^{16}$ | $7.0 \times 10^6$ | 170 | ◎ |
| 1-6 | $5.0 \times 10^{16}$ | $1.1 \times 10^7$ | 150 | ◎ |
| 1-7 | $6.0 \times 10^{16}$ | $1.7 \times 10^7$ | 130 | ◎ |
| 1-8 | $7.0 \times 10^{16}$ | $1.8 \times 10^7$ | 125 | ◎ |
| 1-9 | $8.0 \times 10^{16}$ | $2.5 \times 10^7$ | 75 | ○ |
| 1-10 | $9.0 \times 10^{16}$ | $2.7 \times 10^7$ | 60 | X |
| 1-11 | $10.0 \times 10^{16}$ | $3.0 \times 10^7$ | 50 | X |
| 1-12 | $15.0 \times 10^{16}$ | $2.0 \times 10^8$ | 30 | X |

TABLE 3

Concentration of solid-soluted oxygen: $1.4 \times 10^{18}$ (atoms/cm$^3$)

| No | Concentration of solid-soluted carbon (atoms/cm$^3$) | Number of carbon-oxygen based precipitates (precipitates/cm$^2$) | Size of carbon-oxygen based precipitate (nm) | Leak current |
|---|---|---|---|---|
| 2-1 | $0.5 \times 10^{16}$ | $1.5 \times 10^6$ | 310 | X |
| 2-2 | $1.0 \times 10^{16}$ | $2.0 \times 10^6$ | 290 | Δ |
| 2-3 | $2.0 \times 10^{16}$ | $7.0 \times 10^6$ | 230 | Δ |
| 2-4 | $3.0 \times 10^{16}$ | $1.0 \times 10^7$ | 180 | ○ |
| 2-5 | $4.0 \times 10^{16}$ | $1.5 \times 10^7$ | 160 | ◎ |
| 2-6 | $5.0 \times 10^{16}$ | $2.0 \times 10^7$ | 130 | ◎ |
| 2-7 | $6.0 \times 10^{16}$ | $3.0 \times 10^7$ | 120 | ◎ |
| 2-8 | $7.0 \times 10^{16}$ | $4.0 \times 10^7$ | 100 | ◎ |
| 2-9 | $8.0 \times 10^{16}$ | $4.3 \times 10^7$ | 75 | ◎ |
| 2-10 | $9.0 \times 10^{16}$ | $4.6 \times 10^7$ | 55 | Δ |
| 2-11 | $10.0 \times 10^{16}$ | $5.0 \times 10^7$ | 30 | Δ |
| 2-12 | $15.0 \times 10^{16}$ | $3.0 \times 10^8$ | 25 | X |

TABLE 4

Concentration of solid-soluted oxygen: $1.5 \times 10^{18}$ (atoms/cm$^3$)

| No | Concentration of solid-soluted carbon (atoms/cm$^3$) | Number of carbon-oxygen based precipitates (precipitates/cm$^2$) | Size of carbon-oxygen based precipitate (nm) | Leak current |
|---|---|---|---|---|
| 3-1 | $0.5 \times 10^{16}$ | $2.0 \times 10^6$ | 280 | X |
| 3-2 | $1.0 \times 10^{16}$ | $3.0 \times 10^6$ | 250 | Δ |
| 3-3 | $2.0 \times 10^{16}$ | $9.0 \times 10^6$ | 225 | Δ |
| 3-4 | $3.0 \times 10^{16}$ | $1.5 \times 10^7$ | 175 | ○ |
| 3-5 | $4.0 \times 10^{16}$ | $2.5 \times 10^7$ | 145 | ◎ |
| 3-6 | $5.0 \times 10^{16}$ | $3.0 \times 10^7$ | 105 | ◎ |
| 3-7 | $6.0 \times 10^{16}$ | $5.0 \times 10^7$ | 95 | ◎ |
| 3-8 | $7.0 \times 10^{16}$ | $8.0 \times 10^7$ | 85 | ◎ |
| 3-9 | $8.0 \times 10^{16}$ | $9.0 \times 10^7$ | 75 | ◎ |
| 3-10 | $9.0 \times 10^{16}$ | $9.5 \times 10^7$ | 50 | Δ |
| 3-11 | $10.0 \times 10^{16}$ | $1.0 \times 10^8$ | 25 | Δ |
| 3-12 | $15.0 \times 10^{16}$ | $7.0 \times 10^9$ | 20 | X |

TABLE 5

Concentration of solid-soluted oxygen: $1 \times 10^{18}$ (atoms/cm$^3$)

| No | Concentration of solid-soluted carbon (atoms/cm$^3$) | Number of carbon-oxygen based precipitates (precipitates/cm$^2$) | Size of carbon-oxygen based precipitate (nm) | Leak current |
|---|---|---|---|---|
| 4-1 | $0.5 \times 10^{16}$ | $4.0 \times 10^6$ | 250 | X |
| 4-2 | $1.0 \times 10^{16}$ | $5.0 \times 10^6$ | 230 | Δ |
| 4-3 | $2.0 \times 10^{16}$ | $1.5 \times 10^7$ | 190 | Δ |
| 4-4 | $3.0 \times 10^{16}$ | $2.0 \times 10^7$ | 160 | ○ |
| 4-5 | $4.0 \times 10^{16}$ | $4.0 \times 10^7$ | 130 | ◎ |
| 4-6 | $5.0 \times 10^{16}$ | $7.0 \times 10^7$ | 90 | ◎ |
| 4-7 | $6.0 \times 10^{16}$ | $9.0 \times 10^7$ | 85 | ◎ |
| 4-8 | $7.0 \times 10^{16}$ | $1.5 \times 10^8$ | 80 | ◎ |
| 4-9 | $8.0 \times 10^{16}$ | $1.7 \times 10^8$ | 75 | ◎ |
| 4-10 | $9.0 \times 10^{16}$ | $1.9 \times 10^8$ | 60 | Δ |
| 4-11 | $10.0 \times 10^{16}$ | $2.0 \times 10^8$ | 15 | Δ |
| 4-12 | $15.0 \times 10^{16}$ | $1.0 \times 10^9$ | 7 | X |

TABLE 6

Concentration of solid-soluted oxygen: $1.7 \times 10^{18}$ (atoms/cm$^3$)

| No | Concentration of solid-soluted carbon (atoms/cm$^3$) | Number of carbon-oxygen based precipitates (precipitates/cm$^2$) | Size of carbon-oxygen based precipitate (nm) | Leak current |
|---|---|---|---|---|
| 5-1 | $0.5 \times 10^{16}$ | $2.0 \times 10^7$ | 150 | X |
| 5-2 | $1.0 \times 10^{16}$ | $2.5 \times 10^7$ | 125 | Δ |
| 5-3 | $2.0 \times 10^{16}$ | $8.0 \times 10^7$ | 110 | Δ |
| 5-4 | $3.0 \times 10^{16}$ | $1.5 \times 10^8$ | 80 | ○ |
| 5-5 | $4.0 \times 10^{16}$ | $2.0 \times 10^8$ | 75 | ⊚ |
| 5-6 | $5.0 \times 10^{16}$ | $3.0 \times 10^8$ | 50 | ⊚ |
| 5-7 | $6.0 \times 10^{16}$ | $5.0 \times 10^8$ | 47 | ⊚ |
| 5-8 | $7.0 \times 10^{16}$ | $7.0 \times 10^9$ | 45 | ⊚ |
| 5-9 | $8.0 \times 10^{16}$ | $7.3 \times 10^9$ | 30 | ⊚ |
| 5-10 | $9.0 \times 10^{16}$ | $7.8 \times 10^9$ | 20 | Δ |
| 5-11 | $10.0 \times 10^{16}$ | $8.0 \times 10^8$ | 10 | Δ |
| 5-12 | $15.0 \times 10^{16}$ | $6.0 \times 10^{10}$ | 5 | X |

What is claimed is:

1. A method for producing a solid-state image sensing device, comprising:

growing an epitaxial layer of silicon on a silicon substrate produced from a single silicon crystal containing solid-soluted carbon at a concentration of $3 \times 10^{16}$-$8 \times 10^{16}$ atoms/cm$^3$ and solid-soluted oxygen at a concentration of $1.4 \times 10^{18}$-$1.6 \times 10^{18}$ atoms/cm$^3$;

optionally growing an oxide film and a nitride layer on the epitaxial layer:

subjecting the resulting silicon substrate to device production processes including a low temperature heat treatment of 600° C. to 700° C. such that carbon-oxygen based precipitates having a size in the range of 75 nm to 180 nm (inclusive of 75 nm and 180 nm) are existent in the silicon substrate at a density of $1 \times 10^7$-$1 \times 10^8$ precipitates/cm$^2$, thereby forming a gettering sink in a region close to the epitaxial layer.

* * * * *